United States Patent

Nishikawa et al.

Patent Number: 5,468,930
Date of Patent: Nov. 21, 1995

[54] LASER SPUTTERING APPARATUS

[75] Inventors: Yukio Nishikawa, Ikeda; Kunio Tanaka, Osaka; Yoshikazu Yoshida, Izumi, all of Japan

[73] Assignee: Matsushita Electric Industrial Co., Ltd., Osaka, Japan

[21] Appl. No.: 29,410

[22] Filed: Mar. 10, 1993

[30] Foreign Application Priority Data

Mar. 11, 1992 [JP] Japan .................................. 4-052535

[51] Int. Cl.$^6$ .......................... B23K 26/02; B23K 26/00
[52] U.S. Cl. ................... 219/121.6; 219/121.68; 219/121.75; 427/586; 427/509
[58] Field of Search ............... 219/121.6, 121.68, 219/121.85, 121.86, 121.75; 204/192.38; 427/2, 255.2, 255.3, 533, 586, 596, 126.3, 314, 62, 53.1, 508, 509

[56] References Cited

U.S. PATENT DOCUMENTS

| | | | |
|---|---|---|---|
| 4,604,294 | 8/1986 | Tanaka et al. | 427/53.1 |
| 5,196,101 | 3/1993 | Thakoor | 204/192.26 |
| 5,238,546 | 8/1993 | Bergmann et al. | 204/192.38 |
| 5,242,706 | 9/1993 | Cotell et al. | 427/2 |
| 5,264,412 | 11/1993 | Ota et al. | 501/1 |
| 5,308,461 | 5/1994 | Ahonen | 204/192.11 |
| 5,322,817 | 6/1994 | James et al. | 505/474 |

Primary Examiner—Mark H. Paschall
Attorney, Agent, or Firm—Wenderoth, Lind & Ponack

[57] ABSTRACT

A laser sputtering apparatus includes a laser oscillator for emitting laser beams, a target-supporting member supporting a flat target thereon and being rotatable in a vacuum chamber while the target is inclined relative to the target-supporting member, a driving device for rotating the target-supporting member, a substrate-supporting member for supporting the substrate parallel with the target-supporting member, and an optical device for irradiating the target with the beams emitted by the laser oscillator.

6 Claims, 3 Drawing Sheets

5,468,930

LASER SPUTTERING APPARATUS

BACKGROUND OF THE INVENTION

The present invention relates to a sputtering apparatus, such as a device using a laser, for forming a thin film such as a thin film device.

FIG. 4 shows a typical example of a known laser sputtering apparatus using a laser. The sputtering apparatus comprises a laser oscillator (not shown) for emitting laser beams 1, a lens 2, an incident window 3, a vacuum chamber 4, a target-supporting base 5 for supporting a target 6, and a substrate-supporting base 8 for supporting a substrate 9.

The operation of the laser sputtering apparatus having the above-described construction is described below. The pulse laser beams 1 emitted by the laser oscillator are condensed by the lens 2 and pass through the incident window 3, thus irradiating the target 6 placed on the rotating target-supporting base 5 disposed in the vacuum chamber 4. A plasma plume 7 is generated from the laser beam-irradiated portion of the target 6. As a result, a thin film is formed on the substrate 9 fixed to the substrate-supporting base 8.

However, according to the laser sputtering apparatus having the above-described construction, the plume 7 is jetted in a fixed direction. As a result, the thickness of the center region of the thin film formed on the substrate 9 is greater than that of the other regions thereof. That is, the thin film having a uniform thickness is formed in a small area.

SUMMARY OF THE INVENTION

It is an object of the present invention to provide a laser sputtering apparatus capable of forming a thin film having a uniform thickness over a large area.

In accomplishing these and other objects, according to one aspect of the present invention, there is provided a laser sputtering apparatus comprising: a laser oscillator for emitting laser beams; a target-supporting member supporting a flat target thereon and rotating in a vacuum chamber while the target is inclining the target thereon; a driving device for rotating the target-supporting member; a substrate-supporting member for supporting the substrate parallel with the target-supporting member; and an optical device for irradiating the target by the beams emitted by the laser oscillator.

According to the above construction, a plume is jetted from the target irradiated by laser beams, in a direction perpendicular to the surface of the target. The plume is jetted in different directions with the rotation of the inclined target. Accordingly, the substrate is uniformly exposed to particles of the plume over a large area. As a result, a thin film having a uniform thickness can be formed in a large area on the substrate.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
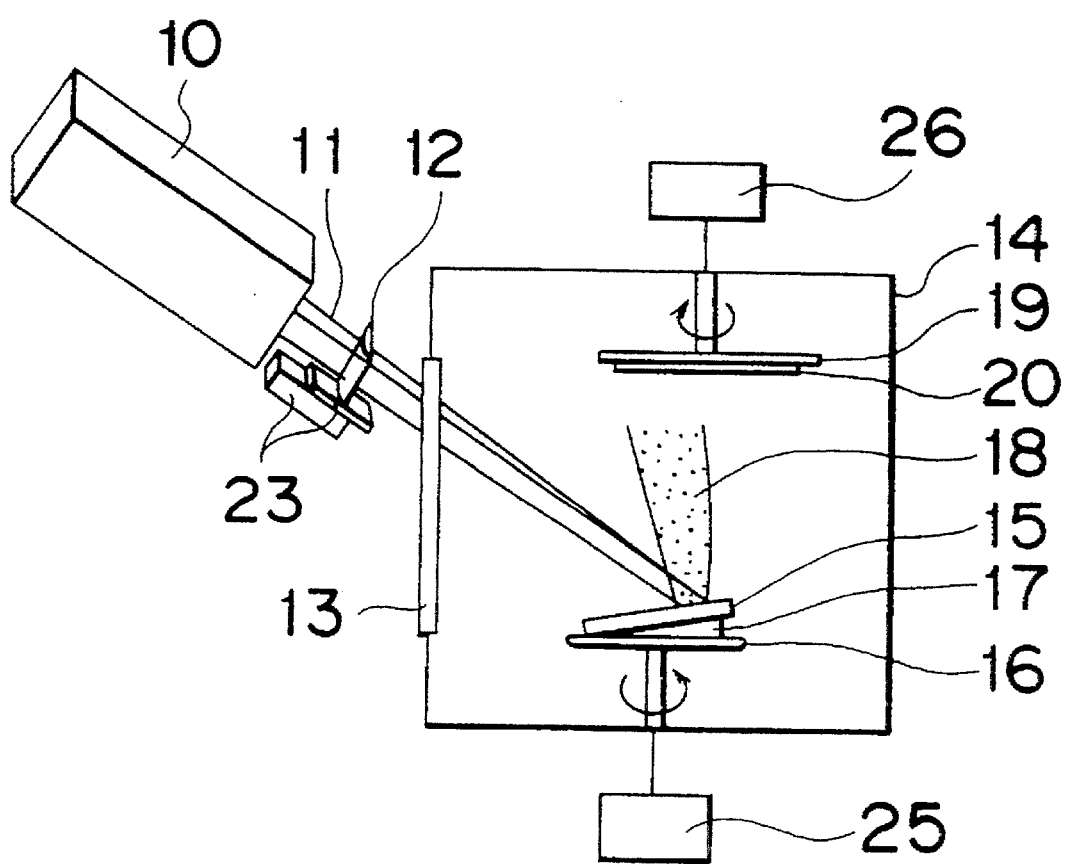
FIG. 1 is a view showing the construction of a laser sputtering apparatus according to an embodiment of the present invention.

Before the description of the present invention proceeds, it is to be noted that like parts are designated by like reference numerals throughout the accompanying drawings.

Figure 2:
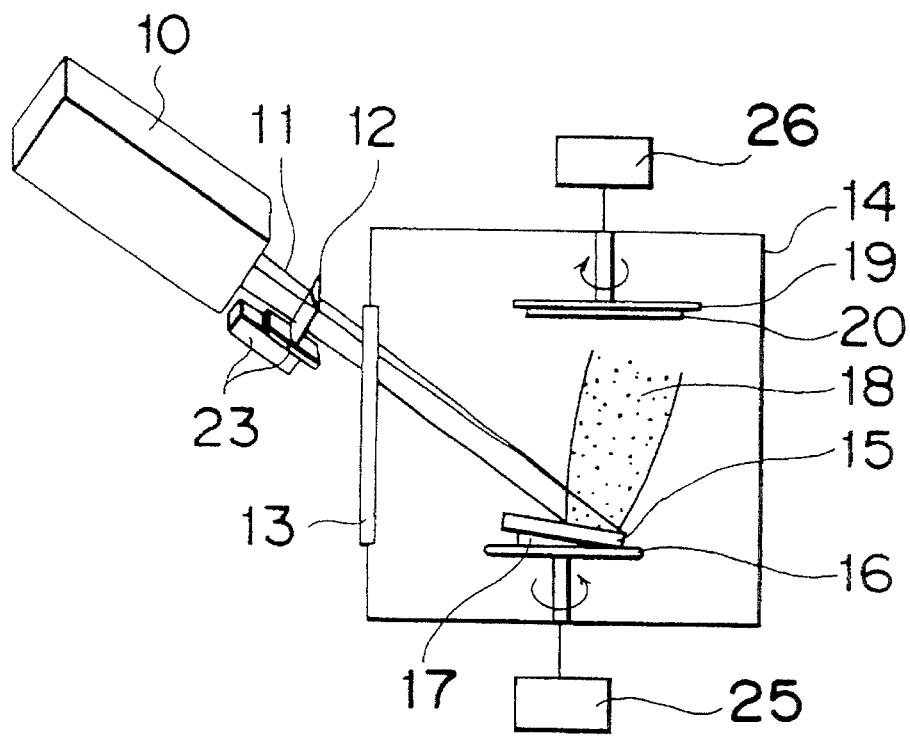
FIG. 2 is a view, showing the construction of the laser sputtering apparatus according to the embodiment of the present invention, for describing the operation thereof.
Figure 3:
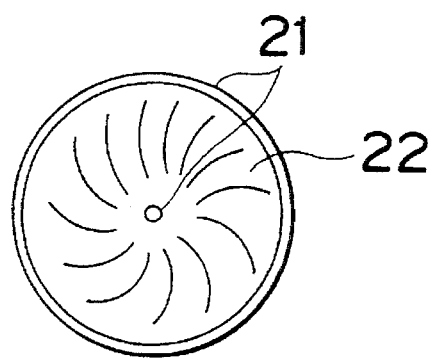
FIG. 3 is a view showing the state of a target surface of the laser sputtering apparatus according to the embodiment of the present invention.
Figure 4:
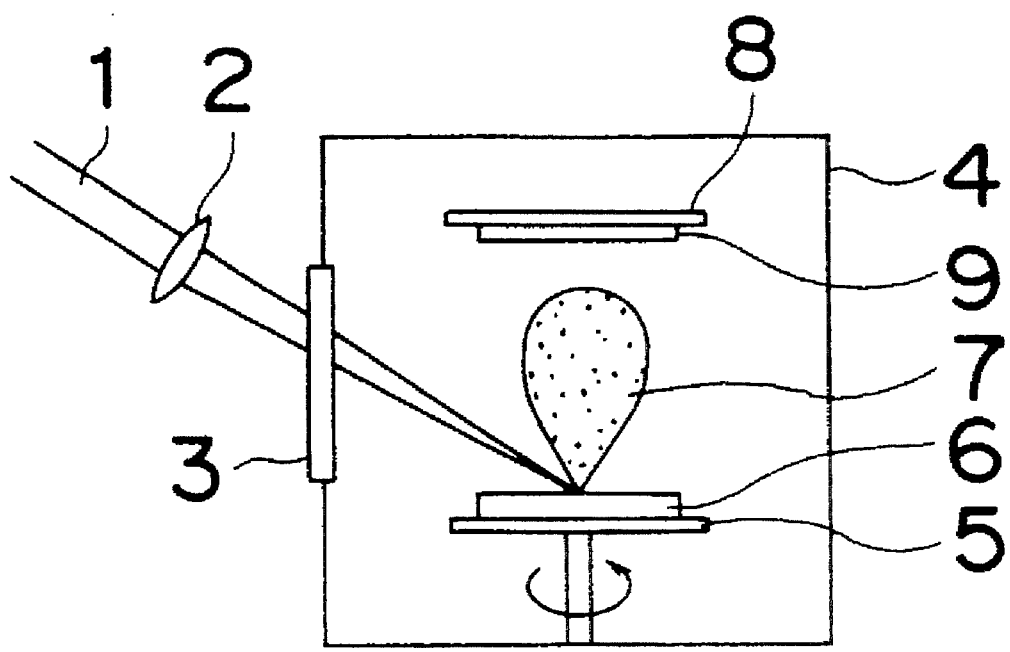
FIG. 4 is a view showing the construction of a conventional laser sputtering apparatus.

Referring to FIGS. 1, 2, and 3, a laser sputtering apparatus according to an embodiment of the present invention is described below.

The laser sputtering apparatus comprises an excimer laser oscillator 10 for emitting laser beams 11; a cylindrical lens 12; an incident window 13; a vacuum chamber 14, a flat target 15; a target-supporting base 16; an inclined base 17; a substrate-supporting base 19 for supporting a substrate 20; and a lens moving mechanism 23. The laser beams 11 are emitted from the excimer laser oscillator 10 and transmit through the incident window 13 to enter the vacuum chamber 14. The beams are irradiated on the target 15. The target 15 is supported on the inclined base 17 to be inclined with respect to the upper surface of the supporting base 16. The inclined base 17 is supported by the supporting base 16 to be rotated together with the target 15 by a driving device 25 such as a motor while the surface of the target 15 is inclined with respect to the upper surface, i.e. the rotating surface of the supporting base 16. The substrate 20 supported by the substrate-supporting base 19 is also rotated by a driving device 26 such as a motor.

The laser beams 11 emitted by the excimer laser oscillator 10 are condensed by the cylindrical lens 12 and pass through the incident window 13, thus irradiating the target 15 disposed in the vacuum chamber 14. The laser beams 11 are condensed in a fixed direction by the cylindrical lens 12 to form an elliptical configuration, thus irradiating the target 15 with the major axis of the ellipse pointing at the rotational center of the target 15. The target 15 is set on the inclined base 17 mounted on the target-supporting base 16. A plume 18 is jetted from a laser beam-irradiated portion of the target 15 in a direction perpendicular to the surface thereof. Accordingly, the plume 18 is jetted in which vary directions with the rotation of the target-supporting base 16. FIG. 2 shows the state of the target 15 which has rotated 180° with respect to the position thereof shown in FIG. 1. Particles of the plume 18 form a thin film over a large area on the substrate 20 mounted on the substrate-supporting base 19 with the plume 18 being jetted in varied directions.

The configuration of the beams 11 which irradiate the target 15 is not necessarily elliptical, but in order to generate the plume 18 efficiently, it is necessary to make the sectional area of the entire configuration of the beams 11 small to increase the density of laser power. Since the beams 11 in the elliptical configuration irradiate the target 15 with the major axis of the ellipse pointing at the rotational center of the target 15, the plume 18 is generated with a large width in the rotational direction of the target 15. As a result, not only in a thin film formed on the surface of the target 15 over a large area, but also the target surface can be efficiently utilized. FIG. 3 shows the state of the target surface on which the thin film has been formed. Portions 21 have not been irradiated by the beams 11 while a region 22 has been irradiated thereby. Since the target surface of the laser-irradiated region 22 has been removed, the height of each of the non-irradiated portions 21 and that of the laser-irradiated region 22 are different from each other. As apparent from FIG. 3, the target surface is utilized with a high efficiency. The surface of the laser-irradiated region 22 is flat. The plume 18 is jetted from the target surface and particles of the plume 18 are deposited on the substrate surface in a circular arc configuration. Consequently, the substrate-supporting base 19 and the target-supporting base 16 are rotated by the driving devices 26 and 25 with the rotational shaft of the former and the rotational shaft of the latter being non-coaxial with each other so as to form a thin film on the entire surface of the substrate 20. In addition, the rotational direction of the target-supporting base 16 is different from that of the substrate-supporting base 19 and/or the angular velocity of the former is different from that of the latter so that the entire surface of the substrate 20 is uniformly exposed to the plume 18, and as a result, the thin film is formed thereon in a uniform thickness over a large area. If the inclination of the inclined base 17 is too great, the surface of the target 15 is irradiated by the beams 11 with the configuration thereof being varied, and as a result, the plume 18 is jetted from the target surface in a varied state. In order to form the beams into a uniform configuration on the target 15, the lens moving mechanism 23 moves the cylindrical lens 12 along the optical axis of the beams 11 in synchronization with the rotation of the target 15. In this manner, the plume 18 is jetted from the target surface in a constant condition.

Using the laser sputtering apparatus of the construction as shown in FIG. 1, a film is formed on a substrate by using a cylindrical lens, the focal length of which is 300 mm with a target inclined by 12°, the diameter of which is 75 mm. As a result, the thickness change of the film formed on the substrate which is 100 mm×100 mm is equal to or smaller than ±10% with the position of the cylindrical lens 12 fixed. According to the conventional method, the thickness change of a film formed on a substrate which is 100 mm×100 mm is equal to or greater than ±20%.

According to the above-described construction, a thin film is formed on the surface of the target over a large area.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A laser sputtering apparatus comprising:

a vacuum chamber;

a target-supporting member rotatably mounted in said vacuum chamber for supporting a target for rotation about a first rotational axis;

a target-inclining member mounted on said target-supporting member for inclining the target relative to said target-supporting member;

a substrate-supporting member for supporting a substrate parallel with said target-supporting member, said substrate-supporting member being rotatably mounted in said vacuum chamber for rotation about a second rotational axis, said second rotational axis being not coaxial with said first rotational axis;

first and second rotary driving devices for rotating said target-supporting member and said substrate-supporting member about said first and second rotational axes, respectively, such that at least one of a rotational direction and an angular velocity of said substrate-supporting member is different than that of said target-supporting member;

a laser oscillator for emitting a laser beam; and an optical device for causing irradiation of the target supported on said target-supporting member, said optical device comprising a condenser lens and a moving mechanism for moving said condenser lens along an optical axis of the laser beam emitted by said laser oscillator.

2. A laser sputtering apparatus as recited in claim 1, wherein said optical device comprises a means for causing the laser beam to have an elliptical configuration with which it irradiates the target, with a major axis of the elliptical configuration pointing at a rotational center of the target.

3. A laser sputtering apparatus as recited in claim 1, wherein said moving mechanism comprises a means for moving said condenser lens in synchronization with rotation of the target-supporting member by said first rotary device so that an entire configuration of the laser beam on the target is constant.

4. A laser sputtering apparatus as recited in claim 1, wherein said first and second rotary driving devices are operable to rotate said target-supporting member and said substrate-supporting member about said first and second rotational axes, respectively, such that the rotational direction and the angular velocity of said substrate-supporting member are different than those of said target-supporting member.

5. A laser sputtering apparatus as recited in claim 1, wherein said first and second rotary driving devices are operable to rotate said target-supporting member and said substrate-supporting member about said first and second rotational axes, respectively, such that the rotational direction of said substrate-supporting member is different than that of said target-supporting member.

6. A laser sputtering apparatus as recited in claim 1, wherein said first and second rotary driving devices are operable to rotate said target-supporting member and said substrate-supporting member about said first and second rotational axes, respectively, such that the angular velocity of said substrate-supporting member is different than that of said target-supporting member.

* * * * *